(12) United States Patent
Choi et al.

(10) Patent No.: US 9,691,796 B2
(45) Date of Patent: Jun. 27, 2017

(54) DISPLAY DEVICE

(71) Applicant: Samsung Display Co., Ltd., Yongin-si, Gyeonggi-do (KR)

(72) Inventors: Jun Won Choi, Cheonan-si (KR); So Young Lee, Asan-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/176,038

(22) Filed: Jun. 7, 2016

(65) Prior Publication Data

US 2016/0379998 A1    Dec. 29, 2016

(30) Foreign Application Priority Data

Jun. 26, 2015  (KR) .......................... 10-2015-0091260

(51) Int. Cl.
| | | |
|---|---|---|
| *H01L 27/14* | (2006.01) | |
| *H01L 29/04* | (2006.01) | |
| *H01L 29/15* | (2006.01) | |
| *H01L 31/036* | (2006.01) | |
| *H01L 27/12* | (2006.01) | |

(52) U.S. Cl.
   CPC .................................. *H01L 27/124* (2013.01)

(58) Field of Classification Search
   USPC .............. 257/13, 40, 79–103, 918, 257/E51.018–E51.022, E33.001–E33.077; 438/22–47, 69, 493, 503, 507, 956
   See application file for complete search history.

(56) References Cited

U.S. PATENT DOCUMENTS

| | | | | |
|---|---|---|---|---|
| 2008/0017855 A1* | 1/2008 | Kim | ....................... | G02F 1/1309 257/48 |
| 2012/0120360 A1* | 5/2012 | Jung | .................. | G02F 1/136286 349/139 |
| 2013/0077008 A1* | 3/2013 | Kim | .................. | G02F 1/136227 349/42 |
| 2014/0146262 A1* | 5/2014 | Yamayoshi | ....... | G02F 1/136227 349/43 |
| 2015/0021591 A1* | 1/2015 | Kim | .................. | H01L 29/78645 257/43 |
| 2015/0102299 A1* | 4/2015 | Hong | .................. | H01L 27/3258 257/40 |

(Continued)

FOREIGN PATENT DOCUMENTS

| | | |
|---|---|---|
| JP | 2010-249955 A | 11/2010 |
| KR | 10-2008-0085411 A | 9/2008 |

(Continued)

*Primary Examiner* — Tram H Nguyen
(74) *Attorney, Agent, or Firm* — Knobbe Martens Olson & Bear LLP

(57) ABSTRACT

A display device is disclosed. In one aspect, the display device includes a substrate, a first signal line formed over the substrate and a first insulating layer formed over the substrate and the first signal line. The display device also includes a second signal line formed over the first insulating layer and including an overlapping area that overlaps the first signal line, a second insulating layer formed over the second signal line and having a via hole that exposes at least a part of the overlapping area. The display device further includes an auxiliary wiring layer covering the via hole and connected to the overlapping area through the via hole.

20 Claims, 9 Drawing Sheets

(56) References Cited

U.S. PATENT DOCUMENTS

2015/0214504 A1\* 7/2015 Sonoda ............... H01L 51/5256
                                                        257/40
2016/0049454 A1\* 2/2016 Park ................... H01L 27/3276
                                                        257/40

FOREIGN PATENT DOCUMENTS

| KR | 10-2011-0051610 A | 5/2011 |
| KR | 10-2013-0061420 A | 6/2013 |
| KR | 10-2014-0049285 A | 4/2014 |

\* cited by examiner

DISPLAY DEVICE

INCORPORATION BY REFERENCE TO ANY PRIORITY APPLICATIONS

This application claims priority to and the benefit of Korean Patent Application No. 10-2015-0091260 filed in the Korean Intellectual Property Office on Jun. 26, 2015, the entire contents of which are incorporated herein by reference.

BACKGROUND

Field

The described technology generally relates to a display device.

Description of the Related Technology

Example types of display devices using different technologies include liquid crystal displays (LCDs), plasma display panels (PDPs), organic light-emitting diode (OLED) displays, field effect displays (FEDs), and electrophoretic display devices.

Recently, various efforts have been made to improve display resolution. To do so, the width of each signal line that transmits a display or control signal is required to be thinner.

However, due to the slim width of the signal line, the signal line is more prone to short-circuit, and product failures increased (leading to reduced manufacturing yields) in products caused by a short-circuit have increased. Accordingly, there needs to be a work around short-circuits of signal lines.

The above information disclosed in this Background section is only to enhance the understanding of the background of the described technology and therefore it may contain information that does not form the prior art that is already known in this country to a person of ordinary skill in the art.

SUMMARY OF CERTAIN INVENTIVE ASPECTS

One inventive aspect relates to a display device that can improve short-circuit failure.

Another aspect is a display device that includes: a substrate; a first signal line formed on the substrate; a first insulating layer formed on the substrate and the first signal line; a second signal line formed on the first insulating layer and including an overlapping area that overlaps the first signal line; a second insulating layer formed on the second signal line and including a via hole that exposes at least a part of the overlapping area; and an auxiliary wiring layer covering the via hole and connected to the overlapping area through the via hole.

In this case, the width of the first signal line may be greater than the width of the second signal line.

The substrate may include a display area where a plurality of pixels are formed and an image is displayed and a peripheral area surrounding the display area, and the via hole may be formed in the peripheral area.

The display area may further include a pixel electrode, and the auxiliary wiring layer may be made of the same material as the pixel electrode.

Thus, the auxiliary wiring layer may include a transparent conductor, or the auxiliary wiring layer may include a plurality of layers.

A conductive material may fill in the via hole of the auxiliary wiring layer.

The first signal line may include molybdenum.

The second signal line may include a first layer including titanium, a second layer including aluminum, and a third layer including titanium.

A cross-section of the via hole may gradually decrease from the surface of the second insulating layer in a direction toward the surface of the second signal line.

Another aspect is a display device comprising: a substrate; a first signal line formed over the substrate; a first insulating layer formed over the substrate and the first signal line; a second signal line formed over the first insulating layer and including an overlapping area that overlaps the first signal line; a second insulating layer formed over the second signal line and having a via hole that exposes at least a part of the overlapping area; and an auxiliary wiring layer covering the via hole and connected to the overlapping area through the via hole.

In the above display device, the width of the first signal line is greater than the width of the second signal line. In the above display device, the substrate comprises a display area including a plurality of pixels and configured to display an image and a peripheral area surrounding the display area, and wherein the via hole is formed in the peripheral area. In the above display device, the second signal line is formed in both the display area and the peripheral area. In the above display device, the auxiliary wiring layer is formed in both the display area and the peripheral area. In the above display device, at least part of the first signal line is formed in both the display area and the peripheral area. In the above display device, the display area further comprises a pixel electrode, and wherein the auxiliary wiring layer is formed of the same material as the pixel electrode.

In the above display device, the auxiliary wiring layer comprises a transparent conductor. In the above display device, the auxiliary wiring layer comprises a plurality of layers. In the above display device, a conductive material fills in the via hole of the auxiliary wiring layer. In the above display device, the first signal line comprises molybdenum. In the above display device, the second signal line comprises a first layer including titanium, a second layer including aluminum, and a third layer including titanium. In the above display device, a cross-section of the via hole gradually decreases from the surface of the second insulating layer in a direction toward the surface of the second signal line.

Another aspect is a display device comprising: a first signal line including a first portion; a first insulating layer formed over the first signal line; a second signal line formed over the first insulating layer, wherein the second signal line includes a second portion that overlaps the first portion of the first signal line; a second insulating layer formed over the second signal line and having a via hole that exposes at least part of the second portion of the second signal line; and an auxiliary wiring layer covering the via hole and connected to the second portion of the second signal line through the via hole.

In the above display device, the second signal line crosses the first portion of the first signal line. In the above display device, the second portion of the second signal line non-linearly extends toward the auxiliary wiring layer. In the above display device, the second portion of the second signal line is formed directly below the auxiliary wiring layer. In the above display device, the auxiliary wiring layer is formed in both a display area and a peripheral area surrounding the display area. In the above display device, the first portion of the first signal line is formed in both the display area and the peripheral area. In the above display device, the auxiliary wiring layer surrounds the via hole.

According to at least one of the disclosed embodiments, although a short-circuit occurs, an auxiliary wiring layer provides a bypass for an electric signal such that a short-circuit failure of the display device can be improved.

DETAILED DESCRIPTION OF CERTAIN INVENTIVE EMBODIMENTS

Figure 1:
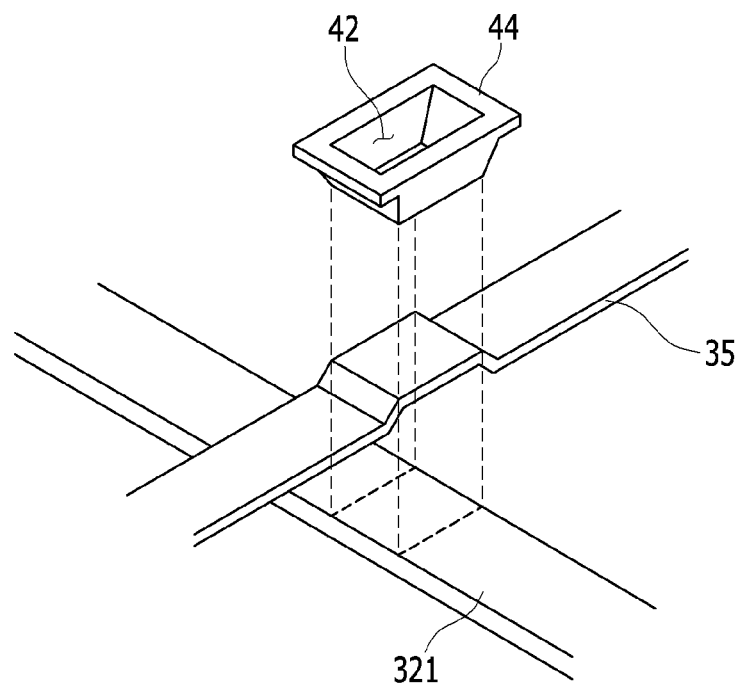
FIG. 1 illustrates an exploded perspective view of an alignment relationship between a first signal line, a second signal line, and an auxiliary wire of the display device according to an exemplary embodiment.

Hereinafter, referring to the drawings, exemplary embodiments will be described in detail. However, in describing the described technology, a description of already known functions or configurations will be omitted so as to make the subject matter of the described technology more clear.

Parts unrelated to the description of the exemplary embodiments are not shown in the drawings to make the descriptions more clear, and like reference numerals designate like element throughout the specification. In addition, the size and thickness of each configuration shown in the drawings are arbitrarily shown for better understanding and ease of description, but the described technology is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present. In this disclosure, the term "substantially" includes the meanings of completely, almost completely or to any significant degree under some applications and in accordance with those skilled in the art. The term "connected" can include an electrical connection.

FIG. 1 illustrates a cross-sectional view of a display device 100 according to an exemplary embodiment. The display device 100 includes a substrate 10, a first signal line 32, a first insulating layer 28, a second signal line 35, a second insulating layer 40, a via hole 42, and an auxiliary wiring layer 44.

The substrate 10 may be formed of a transparent insulating material. In some embodiments, the substrate 10 is formed of a rigid material, such as glass or curable plastic, or a flexible material, such as polyimide (PI) and polyester (PE).

Figure 2:
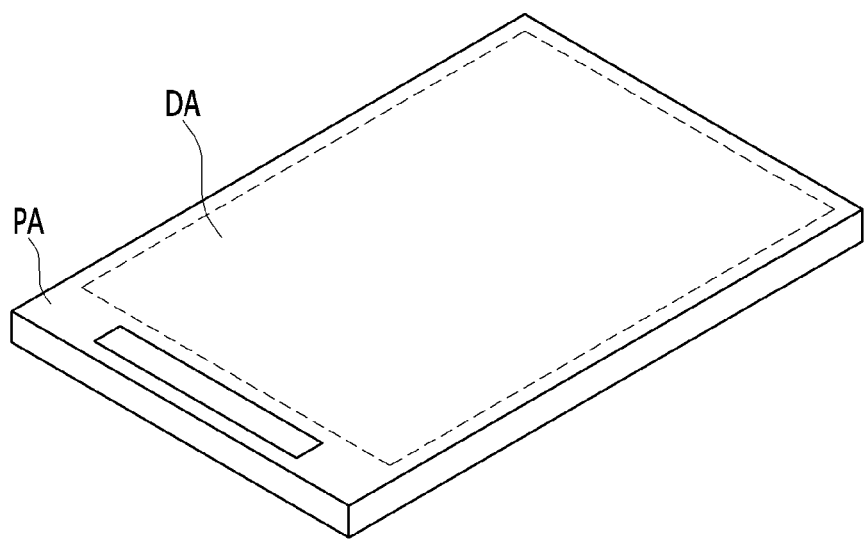
FIG. 2 illustrates an external appearance of the display device of FIG. 1.

In FIG. 2, the substrate 10 illustrates a display area DA and a peripheral area PA. As shown in FIG. 2, the substrate 10 according to the present exemplary embodiment includes the display area DA and the peripheral area PA.

The display area DA includes a plurality of pixels and an electric signal to be converted into light. The peripheral area PA is formed at the periphery area of the display area DA to transmit external power to the display area DA or transmit an electric signal input through the display area DA to a driver.

Figure 3:
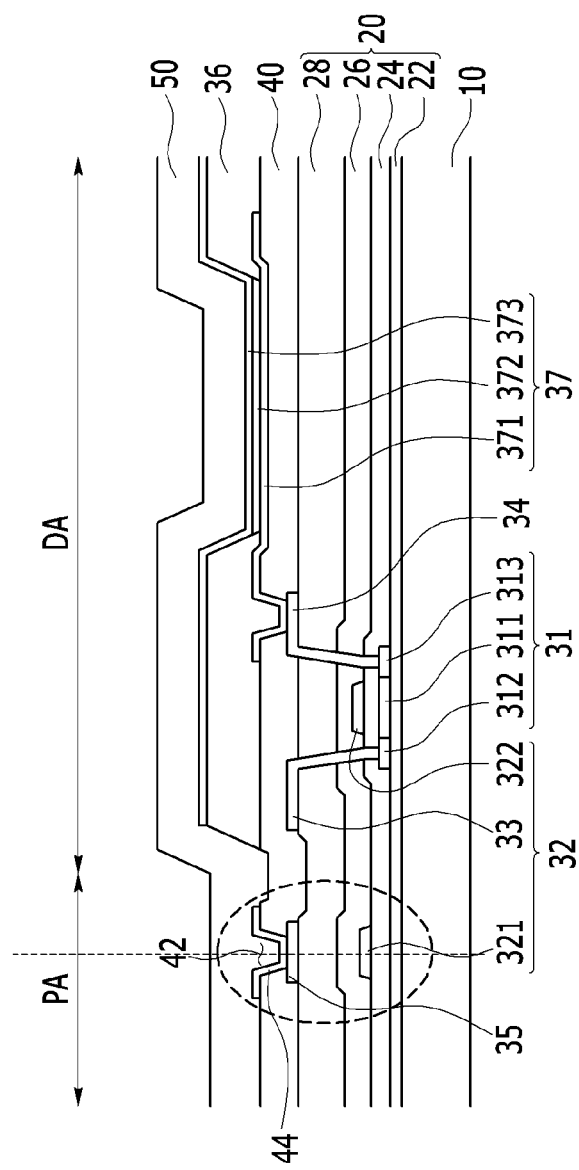
FIG. 3 illustrates a cross-sectional view of a display device according to an exemplary embodiment.

FIG. 3 illustrates a cross-sectional view of the display device 100 including an organic light emitting element according to the exemplary embodiment. However, the scope of the exemplary embodiment is not only applied to the display device including the organic light emitting element, but is also applied to various display devices such as LCDs, PDPs, FEDs electrophoretic display devices.

According to the present exemplary embodiment, a buffer layer 22 is provided on the substrate 10 to protect the substrate 10. The buffer layer 22 can be formed of a plurality of organic or inorganic layers, provide a flat surface for forming a pixel circuit that is to be formed in an emission element layer, and prevent permeation of moisture and foreign impurities into the pixel circuit and the emission element.

As shown in FIG. 3, according to the present exemplary embodiment, a thin film transistor and a capacitor (not shown) are formed on the buffer layer 22 in an area corresponding to the display area DA. The thin film transistor includes a semiconductor layer 31, a gate electrode 322, a source electrode 33, and a drain electrode 34. The thin film transistor shown in FIG. 3 is a driving thin film transistor, and the pixel circuit of the display area DA may further include a switching thin film transistor (not shown). The switching thin film transistor is used as a switching element that selects a pixel for light emission, and the driving thin film transistor applies power for light emission of the selected pixel to the corresponding pixel.

In FIG. 3, the thin film transistor exemplarily has a top gate structure, but the structure of the thin film transistor is not limited thereto. Further, the pixel circuit may be provided with three or more thin film transistors and two or more capacitors.

The semiconductor layer 31 may be formed of polysilicon or an oxide semiconductor, and includes a channel area 311 in which impurities are not doped, and a source area 312 and a drain area 313 in which the impurities are doped at both sides of the channel region 1311.

The first gate insulating layer 24 is formed on the semiconductor layer 31, and may electrically insulate the first signal line 32, including the gate electrode 322 formed on the first gate insulating layer 23, from the semiconductor layer 31.

The first signal line 32 may be formed on the substrate 10 where the semiconductor layer 31 and the first gate insulating layer 24 are formed according to the present exemplary embodiment. The first signal line 32 according to the present exemplary embodiment includes a plurality of gate members and a driving voltage line 321. In the present exemplary embodiment, the gate members include a gate line (not shown) transmitting a gate signal, a gate pad (not shown) connected to an end of the gate line, and a gate electrode 322 connected to the gate line. In the present exemplary embodiment, the driving voltage line 321 may be made of a conductive material so as to transmit a driving voltage ELVDD to a pixel. The first signal line 32 according to the present exemplary embodiment may be made of a metal material including molybdenum (Mo), but this is not restrictive.

The first insulating layer 28 is formed on the first signal line 32. The first insulating layer 28 may be made of an inorganic insulating material such as silicon oxide ($SiO_2$), silicon nitride (SiNx), and the like. The first insulating layer 28 according to the present exemplary embodiment may have a single layered structure or a multi-layered structure. In the present exemplary embodiment, the first insulating layer 28 protects the first signal line 32 formed on the substrate 10 and electrically separates the first signal line 32 and the second signal line 35 formed on the first insulating layer 28. In this case, the second insulating layer 26 is further provided between the first signal line 32 and the first insulating layer 28 to effectively protect the first signal line 32 that includes the plurality of gate members.

The second signal line 35 may be provided on the first insulating layer 28. According to the present exemplary embodiment, the second signal line 35 includes an overlapping area that overlaps the first signal line 32. In the present exemplary embodiment, since a step is formed in the first insulating layer 28 due to the thickness of the signal line 32, the overlapping area may be formed in the second signal line 35 that is disposed on the step formed on the first insulating layer 28 by the first signal line 32.

The second signal line 35 includes a plurality of data members, a plurality of source electrodes 33, and a plurality of drain electrodes 34 according to the present exemplary embodiment. In the present exemplary embodiment, the data members include a plurality of data lines (not shown) transmitting a data signal and crossing the gate line, a plurality of data pads (not shown) connected to ends of the data lines, a plurality of source electrodes 33 connected to the respective data lines, and a plurality of data electrodes 34 respectively paired with the plurality of source electrodes 33, interposing the semiconductor layer 31 therebetween.

The second signal line 35 may be formed of a first layer including titanium (Ti), a second layer including aluminum (Al), and a third layer including titanium (Ti) for improving mechanical and chemical strength and electric conductivity according to the present exemplary embodiment.

The second insulating layer 40 is formed on the second signal line 35, and like the first insulating layer 28, the second insulating layer 50 may be made of an inorganic insulating material such as silicon oxide $SiO_2$, silicon nitride (SiNx), and the like, and accordingly, may protect the second signal line 35.

In this case, the second insulating layer 40 includes a via hole 42 exposing a part or the entire overlapping area where the first signal line 32 and the second signal line 35 overlap each other.

The via hole 42 that partially or wholly exposes the overlapping area may be covered by the auxiliary wiring layer 44. The auxiliary wiring layer 44 covers the via hole 42 and is connected with the overlapping area through the via hole 42. Thus, the auxiliary wiring layer 44 is electrically connected with the second signal line 35.

Figure 4:
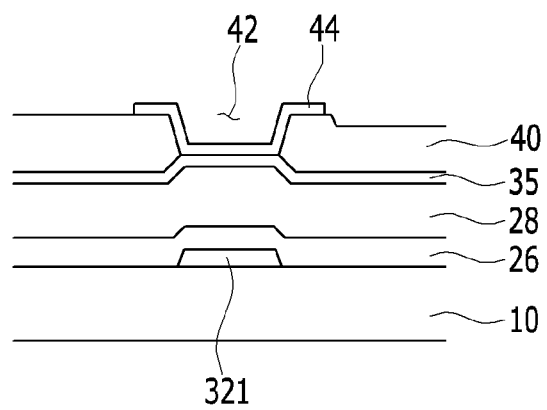
FIG. 4 illustrates a cross-sectional view of the portion shown in FIG. 1 viewed from a different direction.
Figure 5:
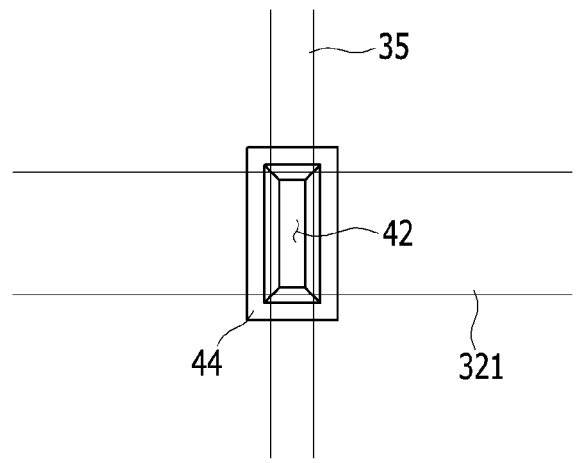
FIG. 5 illustrates a top plan view of FIG. 4.

In the present exemplary embodiment, the via hole 42 may have a cross-section that gradually decreases along a direction toward the overlapping area exposed to the surface of the second signal line 35 from the surface of the second insulating layer 40. Thus, the side surfaces of the via hole 42 may be inclined as shown in FIG. 4, and may have a cross-section as shown in FIG. 5. As shown in FIG. 4 and FIG. 5, the via hole 42 according to the present exemplary embodiment may expose at least a part of the overlapping area of the second signal line 35, and accordingly even though it is not illustrated, the overlapping area may be wholly exposed.

A conductive material fills in the via hole 42 of the auxiliary wiring layer 44 of the present exemplary embodiment. The conductive material filled in the via hole 42 may partially or wholly fill the via hole 42. Thus, although it is not illustrated in the drawings, an auxiliary wiring layer 44 formed by wholly filling the via hole 42 with the conductive material may also be included in the scope of the embodiment.

Figure 6:
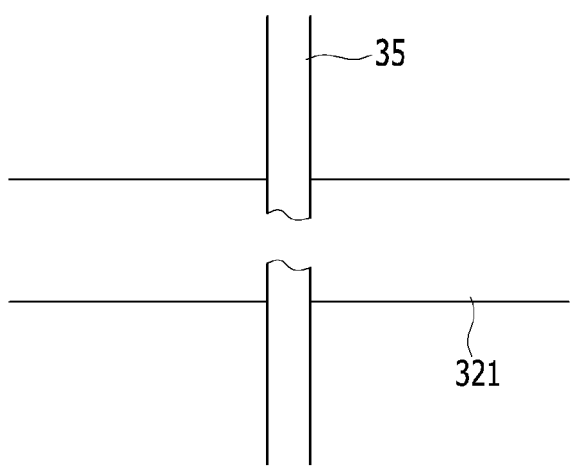
FIG. 6 illustrates the first signal line and a second signal line where a short-circuit has occurred according to the exemplary embodiment.
Figure 7:
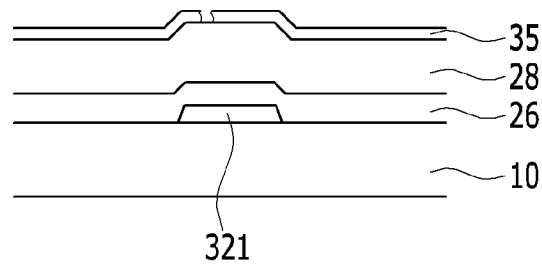
FIG. 7 illustrates a cross-sectional view of the first signal line and the second signal line of FIG. 6.

The width of the second signal line 35 is smaller than the width of the first signal line 32 in the present exemplary embodiment. Thus, as shown in FIG. 6 and FIG. 7, the second signal line 35 may easily short-circuit due to the step formed on the first insulating layer 28 due to the thickness of the first signal line 32. When the second signal line 35 is short-circuited, an electric signal cannot be transmitted to the display area DA, and thus a failure may occur in the entire display device.

Figure 8:
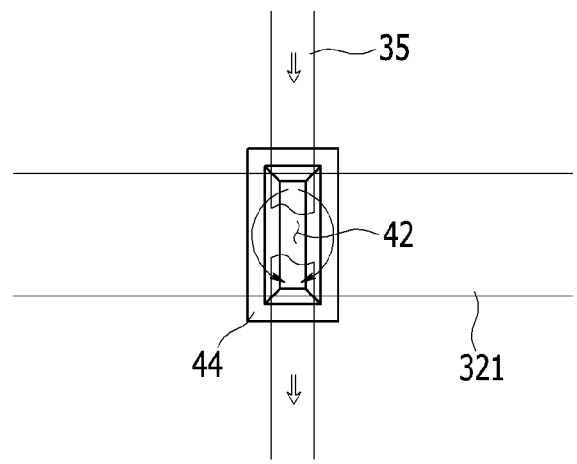
FIG. 8 illustrates a cross-sectional view of an auxiliary wire layer formed on the second signal line of FIG. 6.
Figure 9:
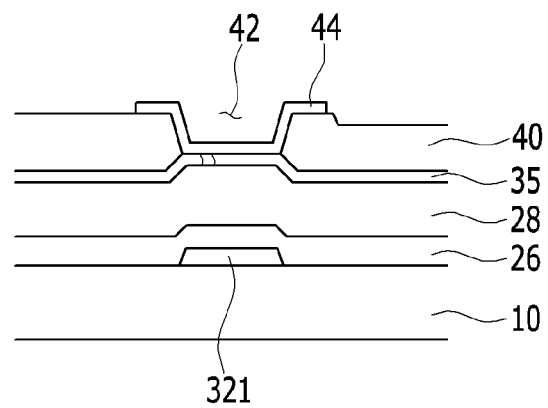
FIG. 9 illustrates a top plan view of an auxiliary wire layer formed on the second signal line of FIG. 7.

In order to improve product failure due to short-circuiting of the second signal line 35, the display device according to the present exemplary embodiment includes the auxiliary wiring layer 44 that is connected to the overlapping area of the second signal line 35. As shown in FIG. 8 and FIG. 9, although the second signal line 35 is short-circuited, the electric signal transmitted by the second signal line 35 may be bypassed through the auxiliary wiring layer 44.

The auxiliary wiring layer 44 of the present exemplary embodiment is not directly electrically connected to other constituent elements, except for the electric connection to the second signal line 35 in the overlapping area. That is, other constituent elements formed on the second insulating layer 40 and the auxiliary wiring layer 44 are independently formed rather than being electrically connected. Thus, the via hole 42 and the auxiliary wiring layer 44 according to the present exemplary embodiment are formed in the peripheral area PA of the substrate 10, and are individually formed from constituent elements other than the second signal line 35, thus when the second signal line 35 is short-circuited, a bypass for the electric signal can be provided.

A display area DA including an organic light emitting element according to the present exemplary embodiment includes a semiconductor layer 31, a second insulating layer 40, a pixel defining layer 36, an organic light emitting element 37, and a thin film encapsulation layer 50, as shown in FIG. 3.

The semiconductor layer 31 and the second insulating layer 40 are the same as those described above, and therefore a duplicate description will not be provided. However, the second insulating layer 40 of the display area DA may further include a via hole for contacting a drain electrode, and the via hole partially exposes the drain electrode 34.

A pixel defining layer 36 that opens an area corresponding to a pixel area is formed on the second insulating layer 40, and an organic light emitting element 37 may be formed in the opened pixel defining layer 36.

The organic light emitting element 37 includes a pixel electrode 371, an organic emission layer 372, and a common electrode 373. The pixel electrode 371 is formed in each pixel, and is connected with a drain electrode 34 of a thin film transistor through the via hole 42 formed for contacting the drain electrode 34. The common electrode 373 is formed throughout the display area DA of the substrate 10. The pixel electrode 371 is surrounded by the pixel defining layer 36 that partitions the pixel area, and the organic emission layer 372 is formed on the pixel electrode 371.

The auxiliary wiring layer 44 may be formed through the same process as the pixel electrode 371. For example, the via hole 42 formed in the second insulating layer 40 and the via hole formed for contacting the drain electrode are respectively covered by the auxiliary wiring layer 44 and the pixel electrode 371. Thus, in order to simplify a process and to save time and costs, the pixel wiring layer 44 and the pixel electrode 371 may be formed with the same material through the same process.

Thus, the auxiliary wiring layer 44 may be formed by including a transparent conductor, like the pixel electrode 371. Further, like the pixel electrode 371 made of a transparent conductor and a metal material and formed of a plurality of layers, the auxiliary wiring layer 44 of the present exemplary embodiment may also include a plurality of layers. For example, the auxiliary wiring layer 44 and the pixel electrode 371 may include electrode materials having a triple-layered structure of ITO-Ag-ITO. However, this is not restrictive, and an electrode material of various combinations may be used to form the auxiliary wiring layer 44 and the pixel electrode 371.

The organic emission layer 372 may be one of a red emission layer, a green emission layer, and a blue emission layer. As an exemplary variation of the present exemplary embodiment, the organic emission layer 372 is formed of a white emission layer or may have a layered-structure of a red emission layer, a green emission layer, and a blue emission layer and thus realize a white color. When a white emission layer is included or an organic emission layer 372 emitting light of a white color is formed, a color filter (not shown) may further be included to emit light of various colors.

One of the pixel electrode 371 and the common electrode 373 is a hole injection electrode (anode) and the other is an electron injection electrode (cathode). Holes injected from the anode and electrons injected from the cathode are combined in the organic emission layer 372 to generate excitons, and light emission is performed when the excitons discharge energy.

At least one of a hole injection layer and a hole transport layer may be provided between the anode and the organic emission layer 372, and at least one of an electron injection layer and an electron transport layer may be provided between the organic emission layer 372 and the cathode. The hole injection layer, the hole transport layer, the electron transport layer, and the electron injection layer may be formed in the entire area of the display area DA of the substrate 10.

One of the pixel electrode 371 and the common electrode 373 may be formed of a metal reflective layer and the other may be formed of a transflective layer or a transparent conductive layer. Light emitted from the organic emission layer 372 is reflective in the metal reflective layer and then emitted to the outside through the transflective layer or the transparent conductive layer. In the case of the transflective layer, light emitted from the organic emission layer 372 is partially re-reflected to the metal reflective layer, such that a resonance structure is formed.

The thin film encapsulation layer 50 encapsulates the organic light emitting element 37 from an external environment that contains moisture and oxygen to thereby prevent the organic light emitting element 37 from being damaged due to moisture and oxygen. The thin film encapsulation layer 50 may have a structure in which a plurality of organic layers and a plurality of inorganic layers are alternately layered.

According to at least one of the disclosed embodiments, even if a short-circuit occurs in the second signal line 35, an electric signal can be bypassed by the auxiliary wiring layer 44 so that a failure due to a short-circuit in the display device can be improved.

While the inventive technology has been described in connection with exemplary embodiments, it is to be understood that the invention is not limited to the disclosed embodiments, but, on the contrary, is intended to cover various modifications and equivalent arrangements included within the spirit and scope of the appended claims. Therefore, the changed example and modified examples should not be appreciated separately from the technical spirit or the viewpoint of the described technology and it should be appreciated that modified exemplary embodiments will be included in the appended claims of the described technology.

What is claimed is:

1. A display device comprising:
   a substrate;
   a first signal line over the substrate;
   a first insulating layer over the substrate and the first signal line;
   a second signal line over the first insulating layer and including an overlapping area that overlaps the first signal line;
   a second insulating layer over the second signal line and having a via hole that exposes at least a part of the overlapping area; and
   an auxiliary wiring layer covering the via hole and connected to the overlapping area through the via hole.

2. The display device of claim 1, wherein the width of the first signal line is greater than the width of the second signal line.

3. The display device of claim 1, wherein the substrate comprises a display area including a plurality of pixels and configured to display an image and a peripheral area surrounding the display area, and wherein the via hole is in the peripheral area.

4. The display device of claim 3, wherein the second signal line is in both the display area and the peripheral area.

5. The display device of claim 3, wherein the auxiliary wiring layer is in both the display area and the peripheral area.

6. The display device of claim 3, wherein at least part of the first signal line is in both the display area and the peripheral area.

7. The display device of claim 3, wherein the display area further comprises a pixel electrode, and wherein the auxiliary wiring layer is the same material as the pixel electrode.

8. The display device of claim 7, wherein the auxiliary wiring layer comprises a transparent conductor.

9. The display device of claim 7, wherein the auxiliary wiring layer comprises a plurality of layers.

10. The display device of claim 1, wherein a conductive material fills in the via hole of the auxiliary wiring layer.

11. The display device of claim 1, wherein the first signal line comprises molybdenum.

12. The display device of claim 1, wherein the second signal line comprises a first layer including titanium, a second layer including aluminum, and a third layer including titanium.

13. The display device of claim 1, wherein a cross-section of the via hole gradually decreases from the surface of the second insulating layer in a direction toward the surface of the second signal line.

14. A display device comprising:
   a first signal line including a first portion;

a first insulating layer over the first signal line;

a second signal line over the first insulating layer, wherein the second signal line includes a second portion that overlaps the first portion of the first signal line;

a second insulating layer over the second signal line and having a via hole that exposes at least part of the second portion of the second signal line; and an auxiliary wiring layer covering the via hole and connected to the second portion of the second signal line through the via hole.

15. The display device of claim 14, wherein the second signal line crosses the first portion of the first signal line.

16. The display device of claim 14, wherein the second portion of the second signal line non-linearly extends toward the auxiliary wiring layer.

17. The display device of claim 14, wherein the second portion of the second signal line is directly below the auxiliary wiring layer.

18. The display device of claim 14, wherein the auxiliary wiring layer is in both a display area and a peripheral area surrounding the display area.

19. The display device of claim 14, wherein the first portion of the first signal line is in both the display area and the peripheral area.

20. The display device of claim 14, wherein the auxiliary wiring layer surrounds the via hole.

\* \* \* \* \*